US008275584B2

(12) United States Patent
Lin et al.

(10) Patent No.: US 8,275,584 B2
(45) Date of Patent: Sep. 25, 2012

(54) UNIFIED MODEL FOR PROCESS VARIATIONS IN INTEGRATED CIRCUITS

(75) Inventors: Chung-Kai Lin, Taipei (TW); Cheng Hsiao, Hsinchu (TW); Sally Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1248 days.

(21) Appl. No.: 11/638,303

(22) Filed: Dec. 12, 2006

(65) Prior Publication Data

US 2008/0140363 A1   Jun. 12, 2008

(51) Int. Cl.
  G06F 7/60 (2006.01)
  G06F 17/18 (2006.01)
  G06F 17/50 (2006.01)
  G01N 37/00 (2006.01)
  G01R 31/14 (2006.01)

(52) U.S. Cl. ............. 703/2; 702/83; 702/118; 702/179; 716/56

(58) Field of Classification Search ........ 703/2; 716/56; 702/83, 118, 179
  See application file for complete search history.

(56) References Cited

U.S. PATENT DOCUMENTS

| | | | |
|---|---|---|---|
| 6,214,704 B1 * | 4/2001 | Xin ............... | 438/471 |
| 6,356,861 B1 * | 3/2002 | Singhal et al. ............ | 703/2 |
| 6,560,568 B1 * | 5/2003 | Singhal et al. ............ | 703/2 |
| 6,975,974 B2 * | 12/2005 | Chien et al. ............ | 703/2 |
| 6,978,229 B1 * | 12/2005 | Saxena et al. ............ | 703/4 |
| 7,441,211 B1 * | 10/2008 | Gupta et al. ............ | 716/2 |
| 7,487,486 B2 * | 2/2009 | Celik et al. ............ | 716/6 |
| 7,493,574 B2 * | 2/2009 | Liu et al. ............ | 716/1 |
| 7,523,021 B2 * | 4/2009 | Vuong et al. ............ | 702/194 |
| 2002/0183989 A1 * | 12/2002 | Chien et al. ............ | 703/2 |
| 2004/0167756 A1 * | 8/2004 | Yonezawa ............ | 703/2 |
| 2005/0235232 A1 * | 10/2005 | Papanikolaou et al. ............ | 716/1 |
| 2005/0273308 A1 * | 12/2005 | Houston ............ | 703/14 |
| 2007/0118331 A1 * | 5/2007 | Venkateswaran et al. .... | 702/179 |
| 2007/0174797 A1 * | 7/2007 | Luo et al. ............ | 716/4 |
| 2007/0198956 A1 * | 8/2007 | Liu et al. ............ | 716/2 |
| 2008/0141190 A1 * | 6/2008 | Jung et al. ............ | 716/4 |

(Continued)

OTHER PUBLICATIONS

SICE: design-dependent statistical interconnect corner extraction under inter/intra-die variations; Feng, Z.; Li, P.; Ren, Z.; Circuits, Devices & Systems, IET vol. 3 , Issue: 5 Digital Object Identifier: 10.1049/iet-cds.2009.0040 Publication Year: 2009 , pp. 248-258.*

(Continued)

*Primary Examiner* — Kamini S Shah
*Assistant Examiner* — Akash Saxena
(74) *Attorney, Agent, or Firm* — Slater & Matsil, L.L.P.

(57) ABSTRACT

A method of developing a statistical model for integrated circuits includes providing a set of test patterns; collecting a set of intra-die data from the set of test patterns; collecting a set of inter-die data from the set of test patterns; generating a total variation sigma (sigma_total) from the set of intra-die data and the set of inter-die data; appointing one of a global variation sigma (sigma_global) and a local variation sigma (sigma_local) as a first sigma, and a remaining one as a second sigma; generating the first sigma from one of the set of intra-data and the set of inter-data; generating the second sigma by removing the first sigma from the sigma_total; generating a corner model for global variations based on sigma_global and the set of inter-die data; and generating a corner model for local variations based on sigma_local and the set of intra-die data.

25 Claims, 3 Drawing Sheets

U.S. PATENT DOCUMENTS

| | | | |
|---|---|---|---|
| 2009/0327989 A1* | 12/2009 | Zhuoxiang | 716/12 |
| 2010/0224790 A1* | 9/2010 | Platzgummer et al. | 250/400 |
| 2011/0040548 A1* | 2/2011 | Khalily et al. | 703/14 |
| 2011/0082680 A1* | 4/2011 | Chang et al. | 703/14 |

OTHER PUBLICATIONS

Lakshmikumar, K. R., et al., "Characterization and Modeling of Mismatch in MOS Transistors for Precision Analog Design," IEEE Journal of Solid-State Circuits, Dec. 1986, pp. 1057-1066, vol. SC-21, No. 6, IEEE.

Singhal, K., et al., "Statistical Device Models from Worst Case Files and Electrical Test Data," IEEE Transactions on Semiconductor Manufacturing, Nov. 1999, pp. 470-484, vol. 12, No. 4, IEEE.

Liou, J. J., et al., "Statistical Modeling of MOS Devices Based on Parametric Test Data for Improved IC Manufacturing," Electron Devices Meeting, Proceedings, Jun. 30, 2001, pp. 31-37, IEEE.

Jackson, J. E., "PCA With More Than Two Variables," Chapters 2.1-2.5, *A User's Guide to Principal Components,* 1991, pp. 26-32, John Wiley & Sons, Inc.

* cited by examiner

UNIFIED MODEL FOR PROCESS VARIATIONS IN INTEGRATED CIRCUITS

TECHNICAL FIELD

This invention relates generally to integrated circuits, and more particularly to modeling of process variations in integrated circuits.

BACKGROUND

The performance of integrated circuits typically exhibits statistical fluctuations due to process variations during the manufacturing processes. Devices and circuits become more sensitive to the process variations as the sizes of integrated circuits continue to be scaled down. To predict the performance variations of devices, statistic modeling is required. Currently, most of foundries provide the "worst case" models, which assume that variations caused by different factors fluctuate in a same direction (corner). Designers are thus guided to over-design integrated circuits, so that the integrated circuits may perform correctly at all extreme corner cases. Furthermore, it is necessary to provide a separated mismatch model that allows designers to assess their circuit robustness against local variations, which are usually performed by using the Monte Carlos simulation.

FIG. 1 illustrates a flow of conventional corner modeling and statistic modeling. The conventional flow uses two independent flows for determining total variation corner and local variation mismatch models. The flow for total variation corner includes the steps of creating a plurality of identical test patterns (step 2), such as transistors, on a plurality of dies, collecting performance data (step 4) of the test patterns, and generating total variation sigma (sigma_total), wherein the term sigma represents standard deviation (step 6). The corners for total variation are then generated (step 8). The other flow is based on the assumption that local variation sigma (sigma_local) is defined from paired transistors mismatch data (step 10), and the respective sigma_local follows the 1/sqrt(W*L) rule (step 12), wherein W and L are the width and the length of transistors, respectively. Local variations are determined based on the Monte Carlos simulation (step 14). Mismatch between paired transistors may also be determined (step 16).

The assumption that sigma_local follows the 1/sqrt(W*L) rule fits well with experiment data of conventional integrated circuits. However, in advanced technologies with smaller scales, the modeling results are not accurate enough for capturing local variations in key electrical parameters. Particularly, the simulated sigma_local becomes greater with the scaling of transistors, hence the decrease in 1/sqrt(W*L). The difference between the real circuit and the model becomes increasingly greater.

A further drawback of the conventional modeling is that in the existing corner models, it is assumed that all devices are sampled at a same process corner, ignoring the fact that differences may arise between devices due to over-chip variations (variations inside a chip). This results in an over-pessimistic design. Designers who are aware of such effect can only manage it by applying an arbitrary combination of existing corner models to resemble the behavior of devices at different locations. Apparently, such a methodology is objective and inaccurate. To ensure robust designs, designers always need to know both the over-chip local variation and global variation. However, the conventional modeling does not separate global and local variations. Without proper description of global and local variations, designers may have to apply the local variations on the corners of total variations, resulting in a double counting of local variations due to the fact that total variations already include local variations. The double counting of local variations may be explained using FIG. 2, which schematically illustrates a parameter space, formed of parameters 1 and 2, for which data is collected from sample devices. Ellipse 20 illustrates an outer boundary of the total variation (sigma_total). Ellipses 22 are local variations (sigma_local) applied at corners 24 of the total variation. It is noted that the predicted variations (within an outer boundary of the shaded area) may be greater than the total variation, which is inside ellipse 20. The shadowed area indicates the extra design margin that will be wasted.

As is known in the art, sigma_local is a portion of the sigma_total. Therefore, sigma_local should always be no greater than sigma_total. However, existing models may provide greater sigma_local than sigma_total. One of the reasons of such a problem is that 1/sqrt(W*L) is used as sigma_local. Therefore, the modeling of sigma_local is separated from the modeling of total variations.

Accordingly, what is needed in the art is a novel modeling method for a more accurate determination of variations, so that less over-design is required. In addition, a unified modeling for local, global and total variations is needed.

SUMMARY OF THE INVENTION

In accordance with one aspect of the present invention, a method of developing a statistical model for integrated circuits includes providing a set of test patterns; collecting a set of intra-die data from the set of test patterns; collecting a set of inter-die data from the set of test patterns; generating a total variation sigma (sigma_total) from the set of intra-die data and the set of inter-die data; appointing one of a global variation sigma (sigma_global) and a local variation sigma (sigma_local) as a first sigma, and a remaining one as a second sigma; generating the first sigma from one of the set of intra-data and the set of inter-data; generating the second sigma by removing the first sigma from the sigma_total; generating a corner model for global variations based on sigma_global and the set of inter-die data; and generating a corner model for local variations based on sigma_local and the set of intra-die data.

In accordance with another aspect of the present invention, a method of developing a statistical model for integrated circuits includes forming a set of test patterns comprising a plurality of identical dies and a plurality of identical groups in each of the identical dies; for a parameter, collecting a set of data from each of the identical groups in each of the identical dies, wherein a set of data from a die form a set of intra-die data, and wherein plurality of sets of data from the plurality of identical dies form a total data set; generating a total variation sigma (sigma_total) from the total data set; for the parameter, determining a median value from the set of intra-data from the die, wherein median values of the parameter for the plurality of identical dies form a set of inter-die data; generating a global variation sigma (sigma_global) from the set of inter-die data; and generating a local variation sigma (sigma_local) by removing the sigma_global from the sigma_total.

In accordance with yet another aspect of the present invention, a method of developing a statistical model for integrated circuits includes forming a set of test patterns comprising a plurality of identical dies and a plurality of identical groups in each of the identical dies; for a parameter, collecting a set of data from each of the identical groups in each of the identical dies, wherein a set of data from a die form a set of intra-die data, and wherein plurality of sets of data from the plurality of identical dies form a total data set; generating a total variation sigma (sigma_total) from the total data set; for the parameter, generating a sigma from a set of intra-data from each of the identical dies to form a set of sigmas; determining a local variation sigma (sigma_local) by averaging the set of sigmas; and generating a global variation sigma (sigma_global) by removing the sigma_local from the sigma_total.

Advantageous features of the present invention include unified modeling of local, global and total variations, which results in a reduction of over-design.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
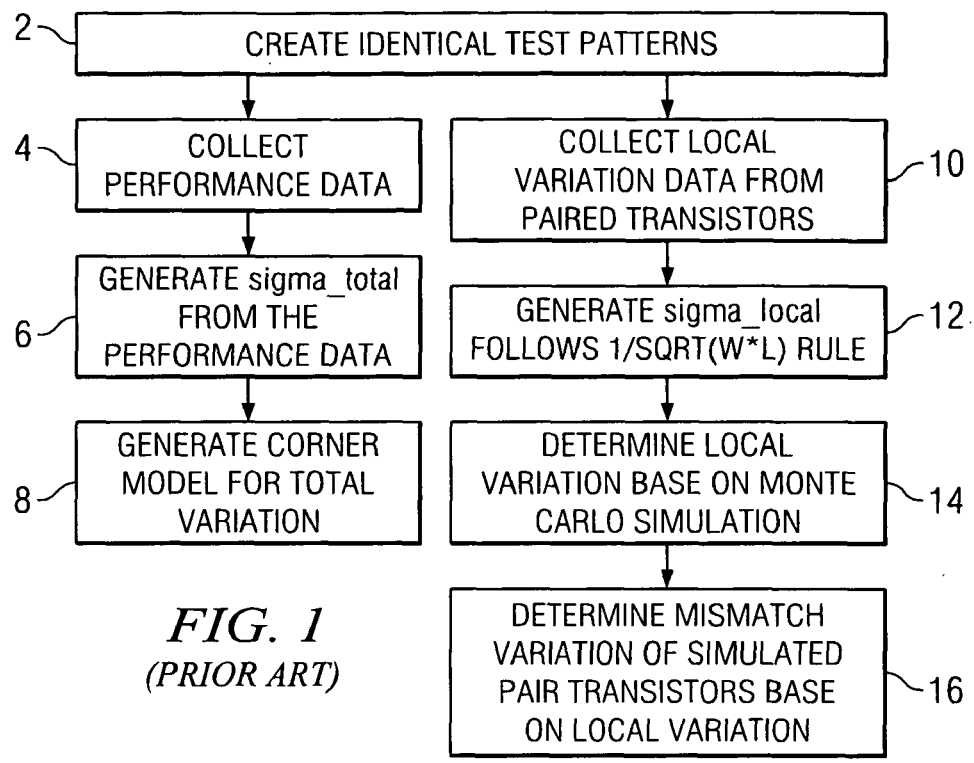
FIG. 1 illustrates a flow of a conventional modeling of process variations.
Figure 2:
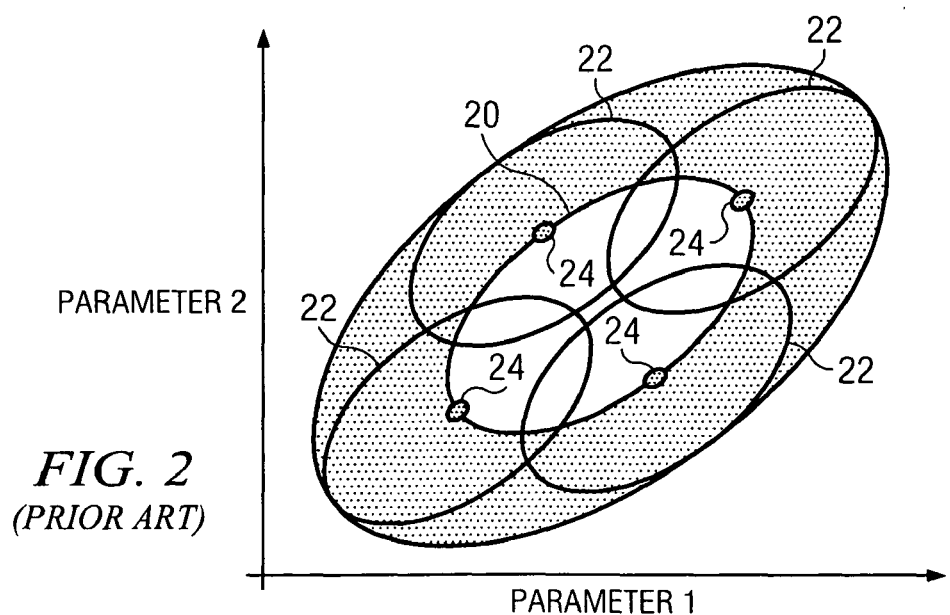
FIG. 2 illustrates a conventional parameter space for a conventional modeling of process variations, wherein local variations are applied at the corners of total variations.
Figure 3:
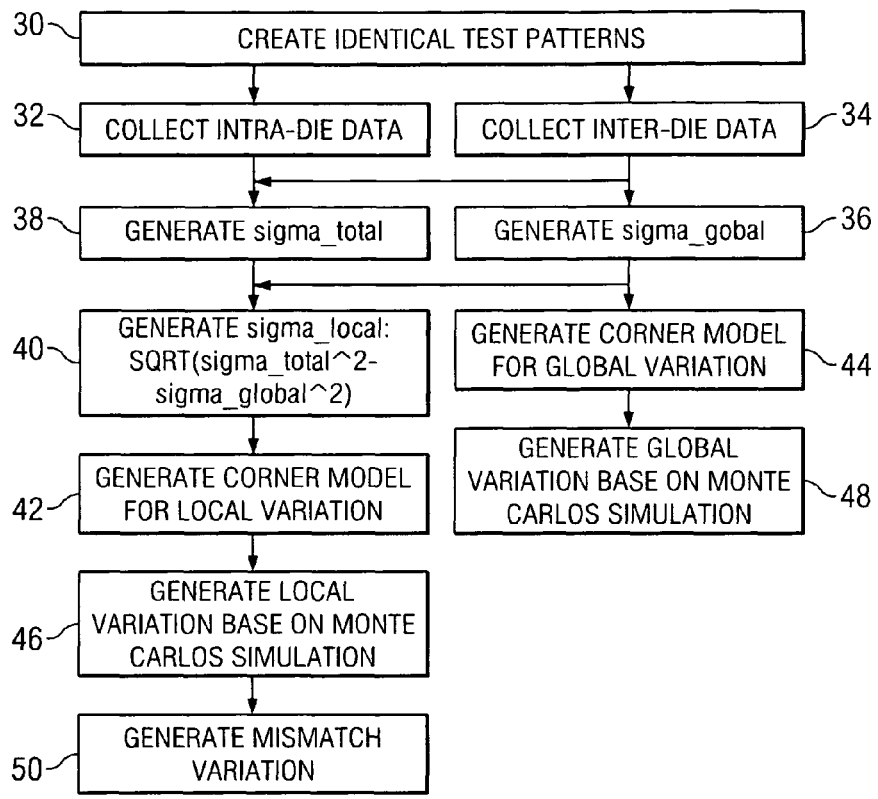
FIG. 3 illustrates a flow of a unified modeling method, wherein the modeling of total variations, global variations and local variations are unified in one model, and wherein the local variations are generated based on the total variations and the global variations.

FIG. 3 illustrates an exemplary flow chart of a first embodiment of the present invention. Generally, the flow describes a process for forming sample devices (a set of test patterns), measuring the test patterns, and developing models from the measured data. Process variations may then be determined from the developed models. Referring to step 30, a set of test patterns is created. The set of test patterns include a number of M dies, wherein M is an integer of greater than about 50, and more preferably greater than about one thousand. The M dies may be located on a plurality of wafers. Each of the dies has an identical pattern as other dies.

In each die, there are N identical device groups, wherein the number N is an integer with a value preferably greater than or equal to about 15, and more preferably greater than about 25. Each device group includes a plurality of test patterns, which includes test devices, for example, metal-oxide-semiconductor (MOS) devices, resistors, capacitors, memory cells, wires, and the like. Not only different types of devices may be included in a device group, the same types of devices with different distinguishing features may also be included in a device group and considered as non-identical devices. The distinguishing features include sizes and surrounding environments, such as pattern densities and proximities (distance from neighboring devices). In other words, test devices in a device group may represent a variety of scenarios in a real die. Preferably, the N device groups are distributed across the entire die. Throughout the modeling process, only parameters of those identical devices are grouped and modeled, wherein identical devices include devices at exactly the same locations of the device groups. Since the N device groups are identical, the devices at the same locations must be identical. In a same group, there may be same type of devices with the same sizes, same proximities, etc. Therefore, in alternative embodiments, these devices may also be considered identical.

For simplicity, throughout the description, when devices are referred to, it is implied that the devices are identical devices, unless specified otherwise. For example, if "MOS devices of all groups of the first die" is referred to, it is implicitly implied that the MOS devices only include those identical devices in the first die. In the above-discussed set of test patterns, there will be N identical devices in each die, and M*N identical devices in M dies.

The devices on the M dies are then tested and performance data is collected (step 32 and 34). The performance data includes data collected for a variety of parameters, including, but are not limited to, threshold voltage $V_{tlin}$ in linear region, threshold voltage $V_{tsat}$ in saturation region, drive current $I_{dlin}$ in linear region, drive current $I_{dsat}$ in saturation region, leakage current $I_{off}$, bulk threshold parameter Gamma, output conductance $G_{ds}$, transconductance $G_m$, and other parameters of interest. From M*N identical devices, M*N data may be collected for each parameter. Step 32 refers to the collection of data from each of the N groups of a die, and the corresponding data is referred to as intra-die data, while step 34 refers to the collection of data from different dies. Accordingly, standard deviation calculated from the intra-die data represents local variation, while standard deviation calculated for the inter-die data represents global variation, which is the variation between dies. Total variation includes both local variation and global variation.

Referring to step 34, in each die, since there are N groups, hence N identical devices, there is N data for each parameter. A median value of the parameter can be found from the N data. As is known in the art, among all N data for the die, half of the data is greater than the median value, and half of the data is less than the median value. Since each die has one median value for each parameter, there will be M median values generated (step 34) for the parameter, each from a die. The M median values are referred to as inter-die data. The median values tend to be substantially free from local variations due to the fact that variations will typically cause values to deviate in all directions, thus canceling each other. On each die, for a plurality of parameters of interest, there is a plurality of median values, each for one parameter.

Global variation sigma (referred to as sigma_global hereinafter) is then determined (step 36), wherein sigma preferably represents standard deviation, although it may represent other commonly used deviations. Since for a parameter, there are M median values from M dies, the standard deviation of the M median values can be calculated. Preferably, three times of the sigma is defined as sigma_global. As is known in the art, three times of the standard deviation is expected to cover the majority of the deviation range. Alternatively, sigma_global may be defined as P times the standard deviation, wherein P is an integer greater than one, and more preferably greater than two. As can be found from preceding paragraphs, sigma_global is substantially free from the influence of local variations since it is derived from median values.

Step 38 illustrates the determination of total variation sigma (referred to as sigma_total hereinafter). As discussed in preceding paragraphs, for each parameter, there are M*N data connected with each collected from one group. A standard deviation (sigma) of the M*N data is then calculated. Similarly, three time of the standard deviation of the M*N data may be defined as total variation sigma, or sigma_total. Alternatively, sigma_total may be defined as standard deviation multiplied by integer P, and the preferred value of P depends on how much process variation can be tolerated. As can be found, since the M*N data includes data inside a die (intra-die data) and data across dies, sigma_total will include both local variations and global variations.

Local variations can then be determined by removing the global variations from the total variations (step 40). In the present invention, it is assumed that sigma_total, sigma_local and sigma_global has a relationship of:

$$\text{sigma\_total}^2 = \text{sigma\_local}^2 + \text{sigma\_global}^2 + \Delta \quad [\text{Eq. 1}]$$

wherein $\Delta$ is a coefficient factor. Further assuming that the coefficient factor $\Delta$ is negligible, there is:

$$\text{sigma\_local} = \text{sqrt}(\text{sigma\_total}^2 - \text{sigma\_global}^2) \quad [\text{Eq. 2}]$$

wherein sqrt means square root. Since sigma_total and sigma_global have been determined in the preceding steps, sigma_local can be calculated.

Figure 5:
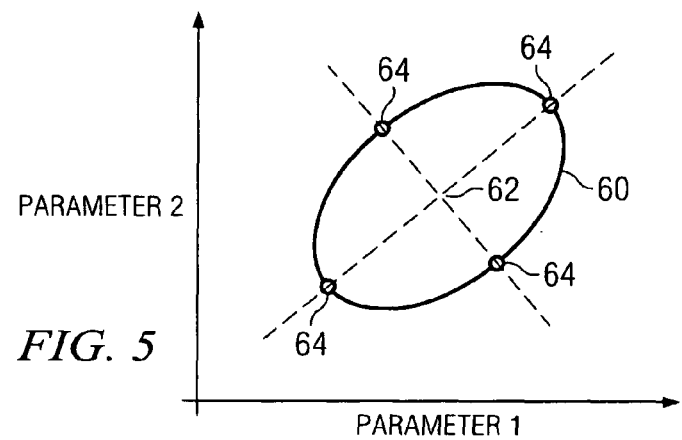
FIG. 5 schematically illustrates an example for explaining the concept of corners in parameter spaces.

With the local variation sigma sigma_local and the collected intra-die data for the parameters, corner models can be generated for local variations (step 42). Similarly, with the global variation sigma sigma-global and the collected inter-die data for the parameter, corner models for global variations can be determined. The generation of corner models are known in the art, thus is not repeated herein. The meaning of corner model is briefly explained using FIG. 5, which illustrates parameter 1 and parameter 2 as X-axis and Y-axis, respectively. The data of parameters 1 and 2 are collected from sample devices. In the illustrated example, loop 60, which typically has an ellipse-shape, is used to represent a variation that causes the data of parameters 1 and 2 to deviate. The variation may be any of the local variation, global variation and total variations. Parameters 1 and 2 may deviate from the center 62 of ellipse 60 to any direction. Corners, such as corners 64, are furthest points that parameters are expected to deviate. Corner models are used for the determination of the relationship between parameters 1 and 2 under process fluctuation.

Referring back to FIG. 3, in step 46, by using the corner models for local variations, local variations may be determined based on Monte Carlos simulation. The mismatch variation of pair devices, such as pair transistors, can then be determined based on local variations (step 50) and by simulating pair of devices. The random differences in the parameters for each pair of devices can be calculated pair by pair, and the variations are defined as a mismatch data set. Similarly, by using the corner models for global variations, global variations may be determined based on Monte Carlos simulation (step 48). The implementation of steps recited in steps 46, 48 and 50 are known in the art, and thus are not discussed in detail.

By performing the steps discussed in preceding paragraphs, the variation model of one or more parameter can be established. Variation models of remaining parameters of interest, such as liner threshold voltage $V_{tlin}$, saturation threshold voltage $V_{tsat}$, linear drain current $I_{dlin}$, saturation drain current $I_{dsate}$, leakage current $I_{off}$, and the like, can be established by repeating processes steps starting step 32.

It is noted that in steps 42 and 44, corner models for local variations and corner models for global variations are both generated. In step 50, mismatch variations are generated. Therefore, the embodiments of the present invention unify the global, local, total, and mismatch variations into a single model. An advantageous feature of the present invention is that sigma_local is developed from sigma_total and sigma_global, this better reflects the real-world scenario, ensuring that sigma_total is always greater than sigma_local and sigma_global.

Figure 4:
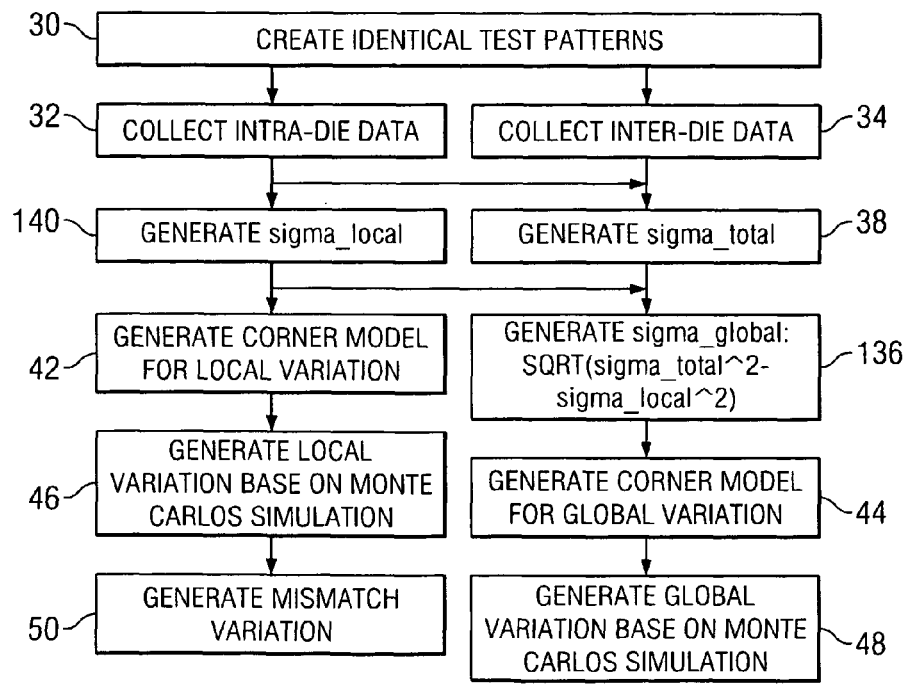
FIG. 4 illustrates another flow of the unified modeling method, wherein the global variations are generated based on the total variations and the local variations.

FIG. 4 illustrates a second embodiment of the present invention. Similar to the first embodiment as shown in FIG. 3, the second embodiment also unifies the modeling of local, global and total variations. However, the second embodiment takes a different approach for determining local and global variations. For simplicity, like reference numerals in FIG. 4 are used to denote steps having similar functions as in the embodiment shown in FIG. 3. The steps 30, 32, 34 and 38 are essentially the same as shown in FIG. 3, and thus are not repeated in detail. After the step of 30, M dies, each having N identical groups, are formed. In steps 32 and 34, the intra-die data and inter-die data are collected. Accordingly, sigma_total is obtained (step 38).

Referring to step 140, sigma_local is determined. Since in each die, there are N groups, hence N identical devices, one parameter will have N values, each from one of the N devices. A standard variation (sigma) can be calculated from the N values. With M dies, M sigma values will be obtained. Sigma_local is the average of the M sigma values. By averaging the M sigma values, the resulting sigma_local is substantially free from the influence of global variations.

From equation 1, it is derived that:

$$\text{sigma\_global} = \text{sqrt}(\text{sigma\_total}^2 - \text{sigma\_local}^2) \quad [\text{Eq. 3}]$$

since sigma_total and sigma_local have been determined in the preceding steps, sigma_global can be calculated.

After the determination of sigma_total, sigma_local and sigma_global, the corner models for local variation and global variations, local and global variations, and mismatch variation can be determined (steps 42 though 50). The details have been discussed in detail in the first embodiment, and thus are not repeated herein.

Figure 6:
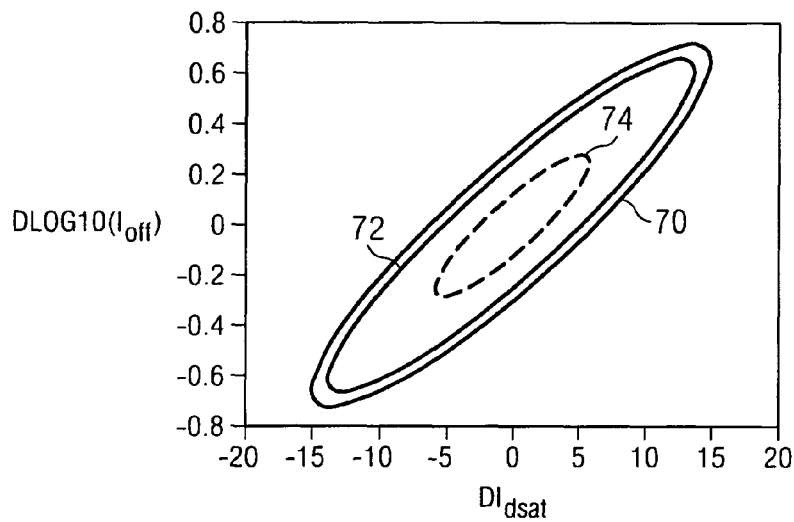
FIG. 6 illustrates a parameter space obtained from sample devices, wherein the illustrated parameters include a drive current in a saturation region of a MOS device and a leakage current of the MOS device.

FIG. 6 illustrates a parameter space of two parameters obtained from experiment results, wherein the measure sample devices are MOS devices. The first parameter is a drain saturation current $I_{dsat}$ of the MOS devices and the second parameter is a leakage current $I_{off}$ in log scale. X-axis and Y-axis are thus variations of drain saturation current Idsat and leakage current Ioff, respectively. From the data collected from sample devices, total variation is illustrated as ellipse 70, and local variation is illustrated as ellipse 72. Global variation will be a loop inside ellipse 70. Dotted loop 74 is drawn to schematically illustrate where global variation should be. Compared to conventional modeling, it is noted that the double counting of local variations has been substantially eliminated. Accordingly, by using the modeling methodology provided by the present invention, over-design in the design of integrated circuits is at least reduced, and possibly substantially eliminated.

Figure 7:
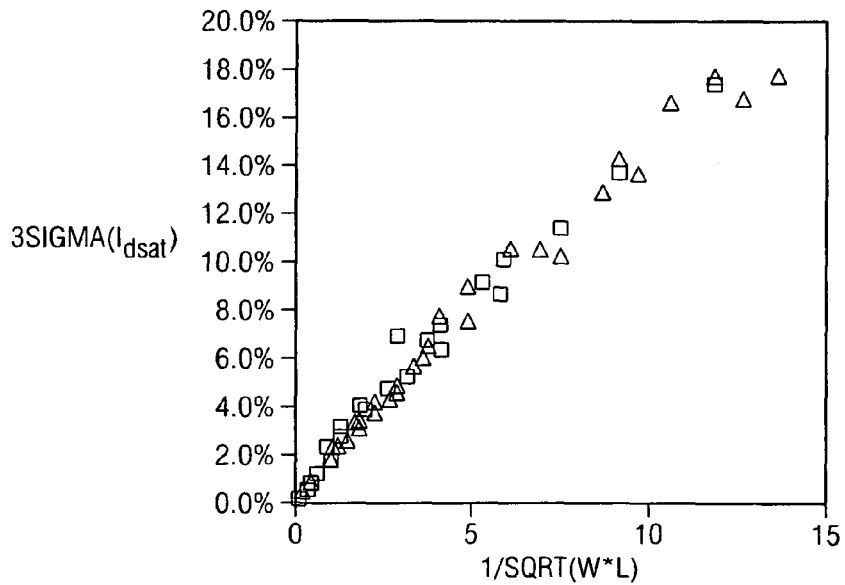
FIG. 7 illustrates a comparison of the results obtained from a model of the present invention to experiment results.

FIG. 7 illustrates results obtained from the model of the present invention. As a comparison, experiment results are also shown. X-axis represents a parameter related to both channel width and channel length of sample MOS devices. Y-axis represents 3-sigma of $I_{dsat}$ local variation. The squares represent simulated local variation drain current for a set of different MOS devices. The triangles represent measured data for the same size as simulated data. It is found that regardless the scaling of integrated circuits, hence the reduction in W and L values, experiment results and modeling results have good matches, proving that the models of the present invention accurately reflect the variation situations in integrated circuits, regardless the scales of the integrated circuits.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of developing a statistical model for integrated circuits, the method comprising:
    creating a set of test patterns of test devices comprising metal-oxide-semiconductor (MOS) devices, resistors, capacitors, memory cells, wires, or a combination thereof, each one of the set of test patterns being on a semiconductor die;
    collecting a set of intra-die data from the set of test patterns;
    collecting a set of inter-die data from the set of test patterns;
    generating a total variation sigma (sigma_total) from the set of intra-die data and the set of inter-die data;
    appointing one of a global variation sigma (sigma_global) and a local variation sigma (sigma_local) as a first sigma, and a remaining one as a second sigma;
    generating the first sigma from the set of intra-die data if the sigma_local is appointed as the first sigma and the set of inter-die data if the sigma_global is appointed as the first sigma, the first sigma being a single numerical value;
    generating the second sigma by removing the first sigma from the sigma_total;
    generating a corner model for global variations based on sigma_global and the set of inter-die data; and
    generating a corner model for local variations based on sigma_local and the set of intra-die data.

2. The method of claim 1, wherein the first sigma is sigma_global.

3. The method of claim 2, wherein the sigma_local is sqrt(sigma_total$^2$−sigma_global$^2$).

4. The method of claim 1, wherein the first sigma is sigma_local.

5. The method of claim 4, wherein the sigma_global is sqrt(sigma_total$^2$−sigma_local$^2$).

6. The method of claim 1 further comprising deriving local variations from the corner model for the local variations, wherein the step of deriving is based on Monte Carlos simulation.

7. The method of claim 6 further comprising deriving mismatch variations based on the local variations and by simulating a pair of transistors.

8. The method of claim 1 further comprising deriving global variations from the corner model for the global variations, wherein the step of deriving is based on Monte Carlos simulation.

9. The method of claim 1, wherein the set of test patterns comprises a plurality of identical dies and a plurality of identical groups in each of the dies.

10. The method of claim 9, wherein the plurality of identical dies comprises more than about one thousand dies.

11. The method of claim 9, wherein the plurality of identical groups in each of the identical dies comprise more than about 15 groups.

12. The method of claim 9, wherein the step of collecting the set of inter-die data comprises:
    measuring data of a parameter from identical devices in the plurality of identical groups on the plurality of dies;
    selecting a median value of the data from the identical devices on each die; and
    grouping median values from the plurality of identical dies to form the set of inter-die data.

13. The method of claim 1, wherein the sigma_total is an integer multiplied by a standard deviation of the set of intra-die data and the set of inter-die data, wherein the integer is greater than two.

14. A method of developing a statistical model for integrated circuits, the method comprising:
    forming a set of test patterns of test devices on a plurality of identical dies, wherein a plurality of identical groups are created on each of the identical dies, the test devices comprising metal-oxide-semiconductor (MOS) devices, resistors, capacitors, memory cells, wires, or a combination thereof;
    for a parameter, collecting a set of data from each of the identical groups in each of the identical dies, wherein a set of data from a die form a set of intra-die data, and wherein plurality of sets of data from the plurality of identical dies form a total data set;
    generating a total variation sigma (sigma_total) from the total data set;
    for the parameter, determining a median value from the set of intra-data from the die, wherein median values of the parameter for the plurality of identical dies form a set of inter-die data;
    generating a global variation sigma (sigma_global) from the set of inter-die data, the sigma_global being different from the set of inter-die data; and
    generating a local variation sigma (sigma_local) by removing the sigma_global from the sigma_total.

15. The method of claim 14, wherein the sigma_local is equal to sqrt(sigma_total$^2$−sigma_global$^2$).

16. The method of claim 14, wherein the set of test patterns comprises devices having a distinguishing feature, and wherein the distinguishing feature is selected from the group consisting essentially of types of devices, sizes of devices, proximities of devices, and combinations thereof.

17. The method of claim 14, wherein the intra-die data and the inter-die data each comprise data selected from the group consisting essentially of drive current in linear region, drive current in saturation region, threshold voltage in linear region, threshold voltage in saturation region, leakage current, bulk threshold parameter, output conductance, and transconductance.

18. The method of claim 14, wherein the sigma_total is an integer multiplied by a standard deviation of the set of intra-die data and the set of inter-die data, and wherein the integer is greater than two, and wherein the sigma_global is the integer multiplied by a standard deviation of the set of inter-die data.

19. The method of claim 14 further comprising:
generating a corner model for global variations based on the sigma_global value and the set of inter-die data;
generating a corner model for local variations based on the sigma_local and the set of intra-die data;
deriving local variations from the corner model for local variations, wherein the step of deriving the local variations is based on Monte Carlos simulation;
deriving mismatch variations based on the local variations and by simulating a pair of devices; and
deriving global variations from the corner model for global variations, wherein the step of deriving the global variations is based on Monte Carlos simulation.

20. The method of claim 19, wherein the mismatch variations comprise differences of parameters between paired devices.

21. A method of developing a statistical model for integrated circuits, the method comprising:
forming a set of test patterns of test devices on a plurality of identical dies, wherein a plurality of identical groups are created on each of the identical dies, the test devices comprising metal-oxide-semiconductor (MOS) devices, resistors, capacitors, memory cells, wires, or a combination thereof;
for a parameter, collecting a set of data from each of the identical groups in each of the identical dies, wherein a set of data from a die form a set of intra-die data, and wherein a plurality of sets of data from the plurality of identical dies form a total data set;
generating a total variation sigma (sigma_total) from the total data set;
for the parameter, generating a sigma from a set of intra-die from each of the identical dies to form a set of sigmas, the set of sigmas being different from the set of intra-die data;
determining a local variation sigma (sigma_local) by averaging the set of sigmas; and
generating a global variation sigma (sigma_global) by removing the sigma_local from the sigma_total.

22. The method of claim 21, wherein the sigma_global is equal to sqrt(sigma_total$^2$−sigma_local$^2$).

23. The method of claim 21, wherein the set of test patterns comprises devices having a distinguishing feature, wherein the distinguishing feature is selected from the group consisting essentially of types of devices, sizes of devices, proximities of devices, and combinations thereof.

24. The method of claim 21 further comprising:
generating a corner model for global variations based on the sigma_global and inter-die data;
generating a corner model for local variations based on the sigma_local and the set of intra-die data;
deriving local variations from the corner model for local variations, wherein the step of deriving the local variations is based on Monte Carlos simulation;
deriving mismatch variations based on the local variations and by simulating a pair of devices; and
deriving global variations from the corner model for global variations, wherein the step of deriving the global variations is based on Monte Carlos simulation.

25. The method of claim 24, wherein the mismatch variations comprise differences of parameters between paired devices.

* * * * *